United States Patent [19]
Yokoyama

[11] 4,037,166
[45] July 19, 1977

[54] BIASING ARRANGEMENT FOR PUSH-PULL AMPLIFIER

[75] Inventor: Kenji Yokoyama, Hamamatsu, Japan

[73] Assignee: Nippon Gakki Seizo Kabushiki Kaisha, Hamamatsu, Japan

[21] Appl. No.: 667,438

[22] Filed: Mar. 16, 1976

[30] Foreign Application Priority Data

Mar. 19, 1975 Japan .................. 50-33152
Mar. 19, 1975 Japan .................. 50-36734[U]
Mar. 19, 1975 Japan .................. 50-36735[U]

[51] Int. Cl.² .................................. H03F 3/18
[52] U.S. Cl. ........................... 330/13; 330/22; 330/24; 330/35
[58] Field of Search .................. 330/13, 15, 18, 22, 330/24, 35, 40

[56] References Cited

U.S. PATENT DOCUMENTS

3,675,142 7/1972 Fichtner .................. 330/15 X

*Primary Examiner*—James B. Mullins
*Attorney, Agent, or Firm*—Cushman, Darby & Cushman

[57] ABSTRACT

A biasing arrangement comprising: a first transistor for driving a pair of field effect transistors (FET's) jointly forming a push-pull amplifier; a second transistor connected in series in the collector circuit of the first transistor, the voltage across the second transistor being applied as the gate-bias voltage for the FET's; and a constant current source connected to the base of the second transistor for causing a substantially constant current to flow through a resistor connected between the collector and base of the second transistor. With this arrangement, across the resistor is developed a stabilized sufficiently large voltage as compared with the base to emitter voltage of the second transistor. Thus, the gate bias voltages of the FET's are stabilized against the fluctuations of the ambient temperature.

8 Claims, 10 Drawing Figures

BIASING ARRANGEMENT FOR PUSH-PULL AMPLIFIER

BACKGROUND OF THE INVENTION a. Field of the Invention

The present invention concerns a push-pull amplifier, and more particularly it pertains to a biasing arrangement for a push-pull amplifier employing FET's as the power amplifying elements in its power amplifying stage.

b. Description of the Prior Art

Description will hereunder be made on a known typical biasing arrangement for a push-pull amplifier by referring to FIG. 1. In this drawing, the respective source electrodes of FET's Q3 and Q4 of the power amplifying stage 1 are connected in common to be grounded via a load RL. The drain electrodes of these FET's are connected to positive and negative first power sources +EC1 and −EC1, respectively. The emitter circuit of a transistor Tr1 of the drive stage 2 is connected to a negative second power source −EC2. Also, the collector circuit of said transistor Tr1 is connected to a positive second power source +EC2 is a biasing circuit 3 and a resistor R1. This biasing circuit 3 includes a transistor Tr2 which is connected in series between the resistor R1 and the transistor Tr1. To the base of this transistor Tr2 is applied, as the base bias voltage, a voltage which is obtained by dividing the collector-emitter voltage $E_B$ of said transistor Tr2 by a series connection of resistors R2 and R3. Said collector-emitter voltage $E_B$ of this transistor Tr2 is intended to be applied, as the gate bias voltages, to said FET's Q3 and Q4. And this gate bias voltage is one which needs to be held constant against the variation in the ambient temperature. In the biasing circuit 3 of such circuit arrangement as described above, it should be understood that, when the base-emitter voltage of the transistor Tr2 fluctuates due to the variation of the ambient temperature, the collector-emitter voltage of the transistor Tr1, i.e. the bias voltage $E_B$ for the FET's Q3 and Q4, will undergo fluctuations accordingly. Symbol C1 represents a capacitor intended for ac short-circuiting the transistor Tr2.

Also, as the FET's Q3 and Q4, there are used, in general, power FET's having a triode-like non-saturation characteristic. Such an FET, however, is of a nature such that its drain current varies whenever its drain-source voltage fluctuates. In other words, any fluctuation of the output voltages of said first power sources +EC1 and −EC1 will bring about an equivalent fluctuation of the gate bias voltage $E_B$ of the FET's of Q3 and Q4. As a result, the operating points of these FET's Q3 and Q4 are caused to fluctuate. Such problems, however, can not be solved by the biasing circuit arrangement of the prior art which has been discussed above.

SUMMARY OF THE INVENTION

It is, therefore, a primary object of the present invention to provide a push-pull amplifier employing FET's, which amplifier is not affected by the fluctuations of the ambient temperature or the variation in the power source voltages.

Another object of the present invention is to provide a biasing arrangement for supplying to said FET's a bias voltage which is stable against the variation of the ambient temperature.

Still another object of the present invention is to provide a biasing arrangement for supplying to said FET's such a bias voltage as will cancel the fluctuations of the operating points of these FET's which are originated from the fluctuations in the power source voltages.

Yet another object of the present invention is to provide a biasing arrangement which does not hamper the amplification function of the amplifier of the type described above for a low frequency signal.

According to an aspect of the present invention, there is provided an improved biasing arrangement for push-pull amplifier, said biasing arrangement comprising: a first transistor for driving a pair of field effect transistors (hereinafter will be referred to as FET's) jointly forming said push-pull amplifier; a second transistor connected in series in the collector circuit of the first transistor and shunted by a capacitor, the voltage across the collector-emitter circuit of the second transistor being applied as the gate bias voltage to the gate electrodes of the FET's; and a constant current source connected to the base of the second transistor for causing a substantially constant current to flow through a resistor connected between the collector and base of the second transistor. Across this resistor is developed a stabilized and sufficiently large voltage as compared with the base to emitter voltage of the second transistor. Thus the gate bias voltages of the FET's are stabilized against the fluctuations of the ambient temperature.

According to another aspect of the present invention, there are applied, to the base of the second transistor in the biasing arrangement of the type described above, fluctuating voltages of the power sources as the power to be supplied to the FET's in order to vary the voltage across the second transistor, i.e. the gate bias voltages of the FET's so that the changes in the drain current of the FET's due to the fluctuations in the drain voltages of the FET's are supressed.

DETAILED DESCRIPTION OF THE PREFERRED EMBODIMENTS

Figure 2:
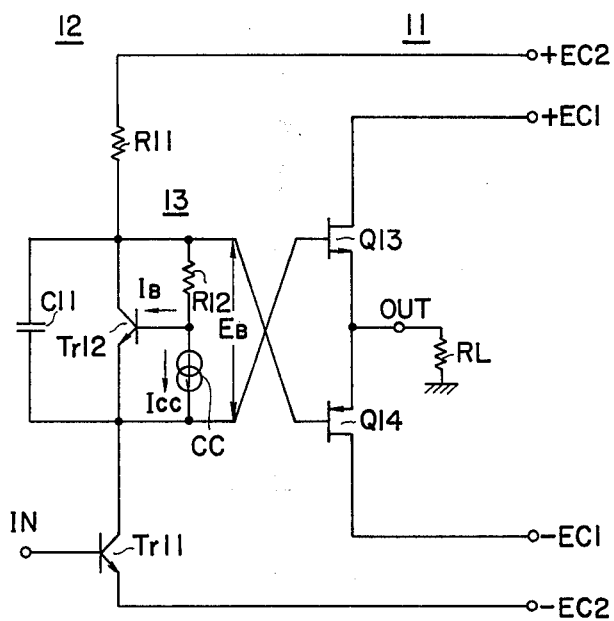
FIG. 2 is a circuit diagram, showing an example of the biasing arrangement of a push-pull amplifier according to the present invention.

FIG. 2 shows an example of the push-pull amplifier according to present invention. The power amplifier stage 11 of this amplifier includes a pair of FET's Q13 and Q14 which are connected in the push-pull mode. The source electrodes of these FET's Q13 and Q14 are connected in common to a load RL. Also, the drain electrodes of these FET's Q13 and Q14 are connected to positive and negative first power sources +EC1 and −EC1, respectively.

The drive stage 12 of the amplifier includes a transistor Tr11, a resistor R11 and a biasing circuit 13. The emitter of this transistor Tr11 is connected to a negative second power source −EC2, preferably via a resistor for improved stabilization of the collector current of this transistor Tr11 against the changes in the ambient temperature. Also, the collector of this transistor Tr11 is connected to a positive second power source +EC2 via the biasing circuit 13 and the resistor R11.

The biasing circuit 13 includes a transistor Tr12 which is connected in series between the resistor R11 and the transistor Tr11. The collector and base of this transistor Tr12 are connected together by a resistor R12. To the base of the transistor Tr12 is connected a constant current flowing circuit CC for the passage of a substantially constant current flow through said resistor R12.

The collector-emitter voltage $E_B$ of the transistor Tr12 is applied, as the bias voltage, to the gate electrodes of the FET's Q13 and Q14 of said power amplifying stage 11. Since the bias circuit 13 is ac short circuited by a capacitor C11, it should be understood that only the resistor R11 will serve as an ac load of the transistor Tr11. It should be understood that, in general, the capacitor C11 need not necessarily be provided for a signal having the audio frequency range, but that, for a signal having a higher frequency than the audio frequency range, it is desirable to shunt the transistor Tr12 by a capacitor C11 to avoid the influence of the internal impedance of the transistor Tr12.

Now, the bias voltage $E_B$ which is obtained by the aforesaid biasing circuit 11, i.e. the collector-emitter voltage of the transistor Tr12, is expressed by the following equation:

$$E_B = (I_B + I_{CC}) \cdot R12 + V_{BE}$$

wherein $V_{BE}$ represents the base-emitter voltage, in the forward direction, of the transistor Tr12 and this $V_{BE}$ will fluctuate in accordance with the ambient temperature. $I_B$ represents the base current of the transistor Tr12. $I_{CC}$ represents the constant current which flows through the constant current flowing circuit CC. According to the present invention, the resistance value of the resistor R12 and constant current $I_{CC}$ are determined so as to satisfy the following format:

$$(I_B + I_{CC}) \cdot R12 >> V_{BE}.$$

Accordingly, even when there occurs a fluctuation of the base-emitter voltage $V_{BE}$ of the transistor Tr12 due to the fluctuation in the ambient temperature, the collector-emitter voltage of the transistor Tr12, i.e. the bias voltage $E_B$ for the FET's Q13 and Q14 will not under go any substantial change.

As stated above, according to the biasing arrangement of the present invention, the operation set-point of the drain currents of the FET's Q13 and Q14 of the power amplifying stage 12 are held substantially constant without being affected by the ambient temperature.

Figure 1:
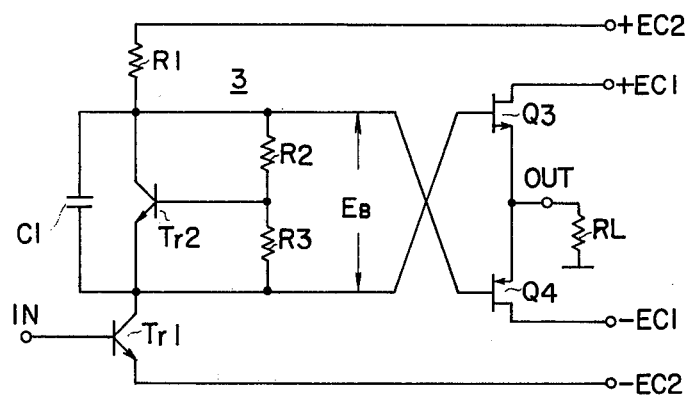
FIG. 1 is a circuit diagram, showing the known biasing arrangement of a push-pull amplifier.

The ac-mode operation of this instant example is exactly the same as that of the amplifier shown in FIG. 1.

The signal which is applied to an input terminal IN is amplified by a drive circuit which is comprised of the transistor Tr11 and its collector load R11, and the resulting amplified signal is applied to the gate electrodes of the FET's Q13 and Q14 to be power amplified by these FET's Q13 and Q14, and the resulting signal is outputted at an output terminal OUT.

Figure 3:
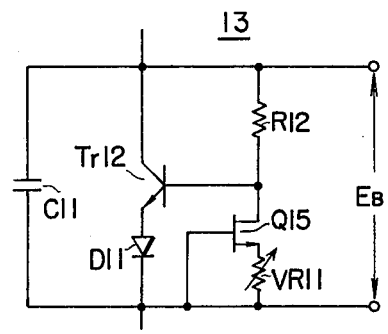
FIGS. 3 and 4 are circuit diagrams, partly omitted, showing an example of a more concrete arrangement of the biasing arrangement shown in FIG. 2.
Figure 4:
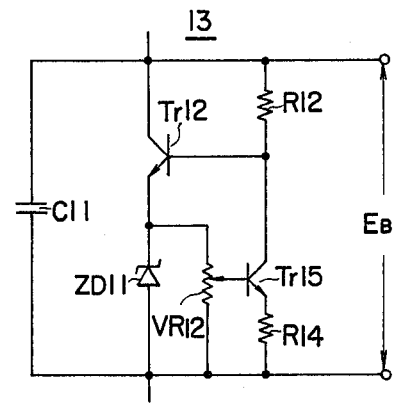

A concrete arrangement example of said biasing circuit 13 is shown in FIGS. 3 and 4. In FIG. 3, a saturation type FET Q15 having a pentode-like characteristic and a variable resistor VR11 constitute said constant current flowing circuit CC shown in FIG. 2. The drain current of the saturation type FET Q15 remains to have a constant value almost without being affected by the drain-source voltage thereof so long as its gate bias voltage is constant. Accordingly, the drain current of the FET Q15 is held at a constant value which is determined by the resistance value of the variable resistor VR15. As the operating voltage for this constant current circuit CC, the forward base-emitter voltage of transistor Tr12 and the forward voltage drop in a diode D11 are utilized.

In FIG. 4, those elements, i.e. a transistor Tr15, a resistor R14, a potentiometer VR12 and a Zener diode ZD11, constitute the constant current flowing circuit CC shown in FIG. 2. By dividing, with the potentiometer VR12, the drop of the constant voltage which develops in said Zener diode ZD11 and by applying the divided voltage to the base circuit of the transistor Tr15, the base current of this transistor Tr15 is held at a constant value. Accordingly, the collector current of the transistor Tr15 becomes constant. This collector current of the transistor Tr15 has a good stability against varying ambient temperature because there is provided a resistor R14.

Figure 5:
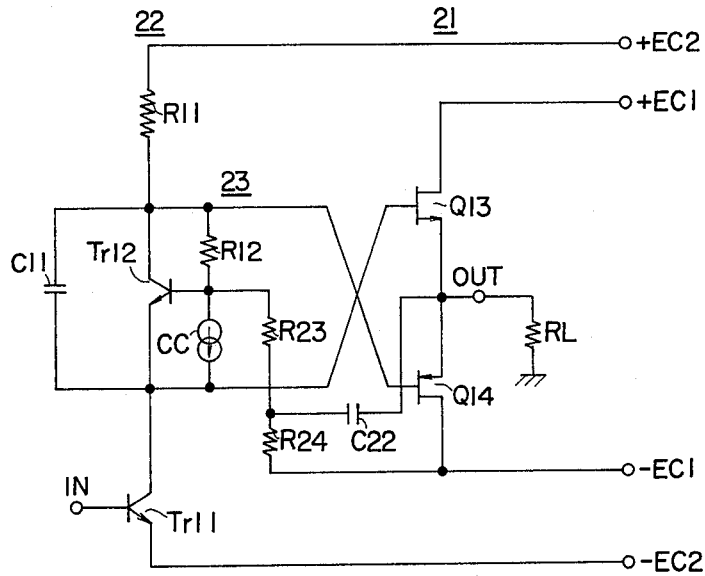
FIG. 5 is a circuit diagram, showing another example of the biasing arrangement of a push-pull amplifier according to the present invention.

FIG. 5 shows an example of the amplifier according to the present invention, which amplifier is intended for a stabilized operation against fluctuations in the power source voltages in addition to the changes in the ambient temperature. The power amplifier stage 21 of this amplifier is of the same arrangement as that of the power amplifying stage 11 of FIG. 2. Also, the drive stage 22 of this amplifier is of an arrangement similar to the drive stage 12 of FIG. 2, with the exception that the base of the transistor Tr12 of the biasing circuit 23 of said drive stage 22 is connected to the negative first power source −EC1 via the resistors R23 and R24 and that the connecting point of the resistors R23 and R24 is connected to the output terminal OUT by a capacitor C22.

In order to prevent the fluctuation of the drain current of the FET's Q13 and Q14 caused by the fluctuations in the output voltages of the first power sources +EC1 and −EC1, i.e. the fluctuations in the drain-source voltages of these FET's Q13 and Q14, the fluctuations in the output voltage of the negative first power source −EC1 is applied to the base of the transistor Tr22 of said biasing circuit 23 via the resistors R23 and R24. As the output voltages of the first power sources +EC1 and −EC1 are thus increased in their absolute values, the collector-emitter voltage of the transistor Tr12 of the biasing circuit 23, i.e. the gate bias voltage $E_B$ of the FET's Q13 and Q14, increases. As a result, the gate electrodes of these FET's Q13 and Q14 are more deeply biased reversely. And thus, an increase in the drain currents of these two FET's Q13 and Q14 is prevented. Conversely, when there arises a decrease in the absolute values of the output voltages of the first power sources +EC1 and −EC1, the gate bias voltage $E_B$ decreases. And thus, a decrease in the drain currents of the FET's Q13 and Q14 is prevented. In this way, the drain currents of the FET's Q13 and Q14 are held at a normal operating value without being affected by the fluctuation in the output voltages of the first power sources +EC1 and −EC1.

As the FET's Q13 and Q14, there are employed non-saturation type power FET's having a triode-like characteristic. Such a power FET is known to operate in such a way that, when there is fluctuation in its drain-source voltage $V_{DS}$, the drain current of this power FET shows a fluctuation to an amount equivalent to such an amount as would be caused by the fluctuation in the gate bias voltages of the FET's Q13 and Q14 of an amount $\Delta V_{DS}/\mu$ of the gate bias voltage of this FET. In the above-mentioned format, $\mu$ represents the voltage amplification factor of this FET, and $\Delta V_{DS}$ represents the amount of the fluctuation in the drain-source voltage $V_{DS}$ of this FET. Accordingly, if the ratio between the resistance value of the resistor R12 and the resistance value of the resistors R23 and R24 of the biasing circuit 23 is set so as to change the respective gate bias voltages of the FET's Q13 and Q14 by an amount $-\Delta V_{DS}/\mu$, it is possible to stabilize the drain currents of these FET's Q13 and Q14 against the fluctuations in the power source voltages.

It should be understood that the collector potential of the transistor Tr11 and the emitter and the collector potentials of the transistor Tr12 undergo variations in accordance with the signal inputted to the input terminal IN. However, to the base circuit of the transistor Tr12 of the biasing circuit 23 is applied an output signal which is delivered at the output terminal OUT via the capacitor C22, and accordingly the base potential of the transistor Tr12 varies in the same phase and in the same amplitude as those of the emitter and collector potentials of the transistor Tr12. Accordingly, the biasing voltage $E_B$ is held constant.

It is additionally stated: in this instant example, said FET's Q13 and Q14 are of the source follower connection. As a result, the output signal which appears at the sources of the FET's Q13 and Q14, i.e. the output terminal OUT, is one having the same amplitude and the same phase as those of the gate input signal of the FET's Q13 and Q14.

Figure 6:
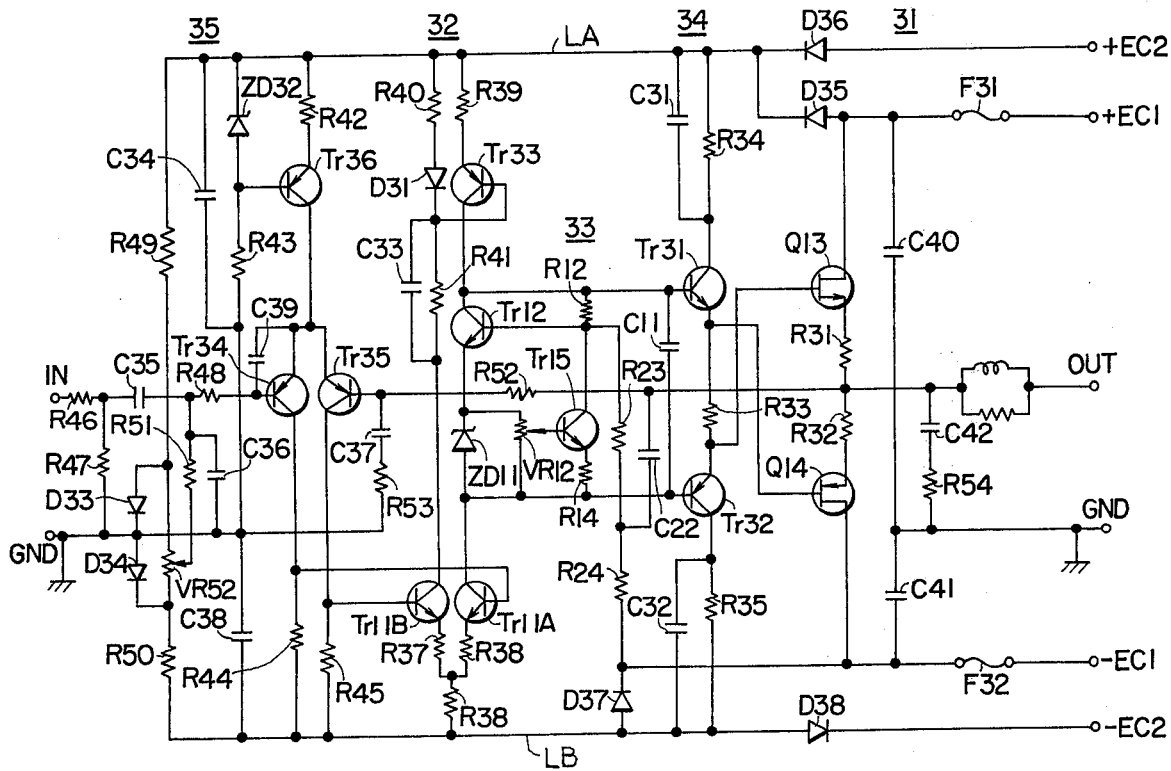
FIG. 6 is a circuit diagram, showing a multi-stage direct-coupled amplifier employing the biasing arrangement of the present invention.

FIG. 6 shows an example of the multi-stage direct-coupled amplifier according to the present invention. This amplifier is comprised of a power amplifying stage 31, a drive stage 32, a buffer stage 34 and a pre-drive stage 35.

The source electrodes of the FET's Q13 and Q14 of the power amplifying stage 31 are jointly connected to the output terminal OUT via resistors R31 and R32 having a low resistance. Also, the respective drain electrodes are connected to the positive and negative first power sources +EC1 and −EC1 via fuses F31 and F32. Also respective gate electrodes of these FET's are connected to the emitters of the transistors Tr31 and Tr32 of the buffer stage 34, respectively. The emitters of the transistors Tr31 and Tr32 are connected to each other via a resistor R33. Also, the respective collectors of these transistors are connected to the positive and negative power lines LA and LB, respectively, via parallel connections of the resistors R34, R35 and capacitors C31 and C32. The bases of the transistors Tr31 and TR32 are connected to a biasing circuit 33 of the drive stage 32.

This biasing circuit 33 is of an arrangement such that the constant current flow circuit CC of the biasing circuit 23 shown in FIG. 5 is modified into the arrangement shown in FIG. 4.

The drive stage 32 is comprised of: the biasing circuit 33; a differential amplifier consisting of a pair of transistors Tr11A and Tr11B and resistors R36, R37 R38; and the load circuit of the differential amplifier circuit consisting of a transistor Tr33, resistors R39, R40, R41, a capacitor C33 and a diode D31.

The pre-drive stage includes: a pair of transistors Tr34, Tr35 of differential connection, and a constant current flowing circuit consisting of a transistor Tr36, a Zener diode ZD32, resistors R42, R43 and a capacitor C34. The respective collector electrodes of the transistors Tr34, Tr35 are connected to the base electrodes of the transistors Tr11A, Tr11B and via respective resistors R44 and R45 to the power line LB. To the base electrode of the transistor Tr34 is applied an input signal through an input network consisting of resistors R46, R47, R48 and capacitors C35, C36 and is supplied a base bias voltage by a base biasing circuit of resistors R49, R50, R51, a potentiometer VR52 and diodes D33, D34. The output signal at the output terminal is fed back to the base electrode of the transistor Tr35 through a feedback network composed of resistors R51, R52 and a capacitor C37.

The positive power line LA is connected via diodes D35, D36 to the positive first power source +EC1 and a positive second power source +EC2, respectively. The negative power line LB is connected via diodes D37, D38 to the negative first power source −EC1 and a negative second power source −EC2, respectively. These diodes are provided as switch-over means to prevent the excessively large rush current from flowing through the FET's Q13, Q14 upon turning on the power switch not shown of the amplifier. In other words, the output voltages of the second power sources +EC2 and −EC2 are stabilized. Therefore it is ordinary that their build-up is slower than the build-up of the output voltages of the first power sources +EC1 and −EC1. As such, if there is not provided a switch-over means consisting of the diodes D35 – D38, it should be understood that in the stage immediately after the power switch of the amplifier is turned on, predetermined voltages are supplied to the drain electrodes of the FET's Q13 and Q14 (which are ordinarily of the depletion type such that even at zero gate bias, drain currents are allowed to flow to these FET's Q13 and Q14). On the other hand, however, in view of the fact that the output voltages of the second power sources +EC2 and −EC2 do not build up, the biasing circuit 33 remains to be inoperative. Accordingly, the FET's Q13 and Q14 are rendered to the zero gate bias state. As a result, an excessively large rush current is caused to flow to these FET's Q13 and Q14.

In this instant example, however, it should be noted that so long as the output voltages of the second power sources +EC2 and −EC2 do not build up, the diodes D35 and D37 are rendered conductive. Through these conductive diodes D35 and D37, the output voltages of the first power sources +EC1 and −EC1 are applied to the power lines LA and LB. And, simultaneously with the build-up of the output voltages of the first power sources +EC1 and −EC1, there are applied the biasing voltages to the gate electrodes of the FET's Q13 and Q14. Accordingly, there no longer takes place a flow of an excessively large rush current to the FET's Q13 and Q14. After the output voltages of the second power sources +EC2 and −EC2 have built up, the diodes D36 and D38 are rendered conductive. And, the output voltages of the second power sources +EC2 and −EC2 are applied to the power lines LA and LB, respectively. On the other hand, the diodes D35 and D37 are rendered non-conductive. Thus, the first power sources +EC1 and −EC1 are cut from the power lines LA and LB.

The signal operation of this amplifier and the operation of the biasing circuit 33 will be appreciated easily from the description of the preceding example. Therefore, no further explanation of these operations will be made here.

In FIG. 6, symbols C38, C39, C40, C41 and C42 represent capacitors, and R54 represents a resistor.

Figure 7:
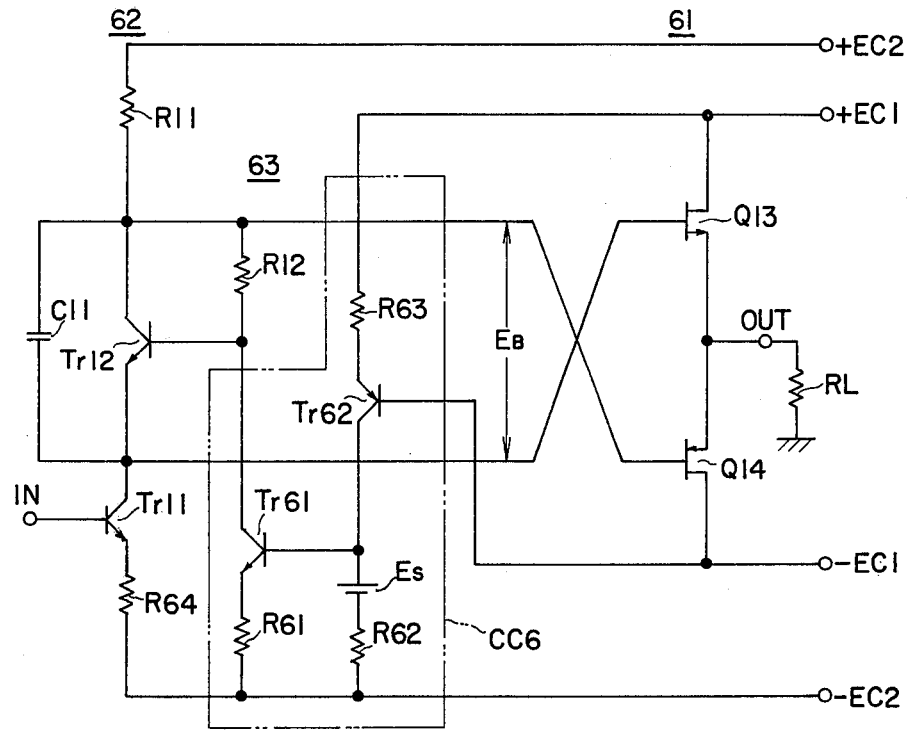
FIG. 7 is a circuit diagram, showing still another example of the biasing arrangement of a push-pull amplifier according to the present invention.

FIG. 7 shows another example of the amplifier according to the present invention. The power amplifying stage 61 of this amplifier is identical with that 11 of FIG. 2. Also, the biasing circuit 63 of the drive stage 62 includes a unique constant current flowing circuit CC6 consisting of transistors Tr61 and Tr62, resistors R61, R62 and R63, and a constant voltage source $E_S$. The transistor Tr22 has its base connected to the negative first power source −EC1; its emitter connected via the resistor R63 to the positive first power source +EC1; and its collector connected, via the constant voltage source $E_S$ and the resistor R62, to the negative second power source −EC2. The base of the transistor Tr61 is connected to the collector of the transistor Tr62, the collector connected to the base of the transistor Tr12, and the emitter connected to negative second power source −EC2 via the resistor R61. The fluctuations in the output voltages of the first power sources +EC1 and −EC1 are applied to the base of the transistor Tr61 after being amplified by the transistor Tr62. Thus, the collector current of the transistor Tr61, i.e. the current flowing through the resistor R12 connected between the base and the collector of the transistor Tr12 varies. Accordingly, the collector-emitter voltage of the transistor Tr12 is controlled in such a way that the drain currents of the FET's Q13 and Q14 will become constant. More specifically, in this biasing circuit 63, the biasing voltage $E_B$ for the FET's Q13 and Q14 is controlled by varying (controlling) the value of the current which flows through the constant current flowing circuit CC6 by the output voltages of the first power sources +EC1 and −EC1, in place of providing those resistors R23 and R24 of the biasing circuit 23 of FIG. 5 which are connected between the base electrode of the transistor Tr12 and the negative first power source −EC1. As will be clearly understood from FIG. 7, the current which flows through the constant current flowing circuit CC6, i.e. the value of the current flowing through the resistor R12, is controlled in accordance with the sum of the two output voltages of the positive and the negative first power sources +EC1 and −EC1. Accordingly, by the employment of this biasing circuit 63, the drain currents of the FET's Q13 and Q14 can be held constant even if the respective output voltages of these power sources fluctuate independently of each other.

Also, the biasing circuit 23 of FIG. 5 is arranged so that a signal which fluctuates with the same phase and the same amplitude as those of the emitter voltage of the transistor Tr12, i.e. an output signal at the output terminal OUT, is applied to the base of the transistor Tr12 via the capacitor C22 to insure that the biasing voltage $E_B$ will not fluctuate, regardless of the amplitude of the input signal. However, in view of the fact that the capacitor has an increased impedance for a low frequency signal, it should be understood that in case an input signal of a low frequency is inputted, the biasing voltage $E_B$ will undergo fluctuation, and as a result it becomes impossible to faithfully amplify such an input signal.

In contrast thereto, in the biasing circuit 63 of FIG. 7, the base of the transistor Tr12 is substantially separated from the first power sources +EC1 and −EC1 by the transistors Tr61 and Tr62 of the constant current flowing circuit CC6. Therefore, there is no more need to provide such capacitor C22 and the like. And, even when a low frequency input signal is inputted to the amplifier, the biasing voltage $E_B$ will not fluctuate. Accordingly, the low frequency input signal can be faithfully amplified.

In FIG. 7, symbol R64 represents a resistor. However, this resistor R64 may be omitted.

Figure 8:
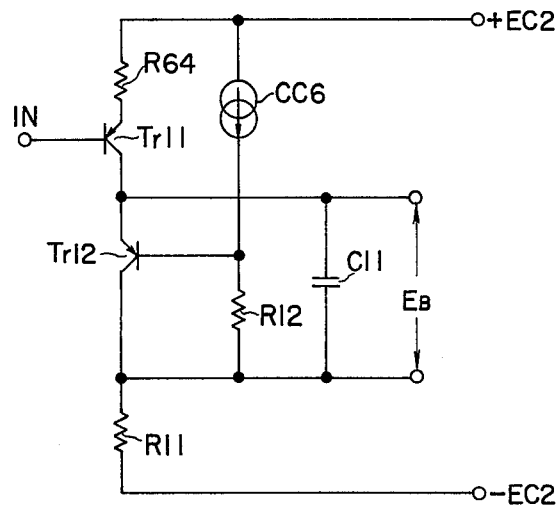
FIGS. 8 and 9 are circuit diagrams, partly omitted, showing modifications of the biasing arrangement shown in FIG. 7.
Figure 9:
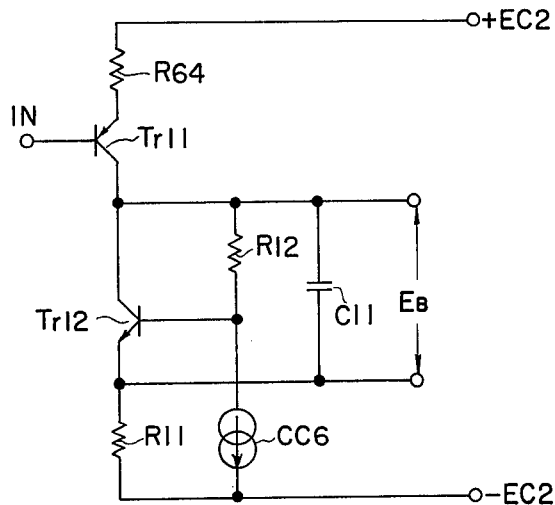

FIG. 8 and FIG. 9 show modified examples of the drive stage 62 and the biasing circuit 63 of FIG. 7, respectively. In FIG. 8, pnp-type transistors are employed in place of the transistors Tr11 and Tr12. Also, in FIG. 9, a pnp-type transistor is used in place of the transistor Tr11, and an npn-type transistor is employed in place of the transistor Tr12. With the exception of these, the entire circuitry is equivalent to that of FIG. 7.

Figure 10:
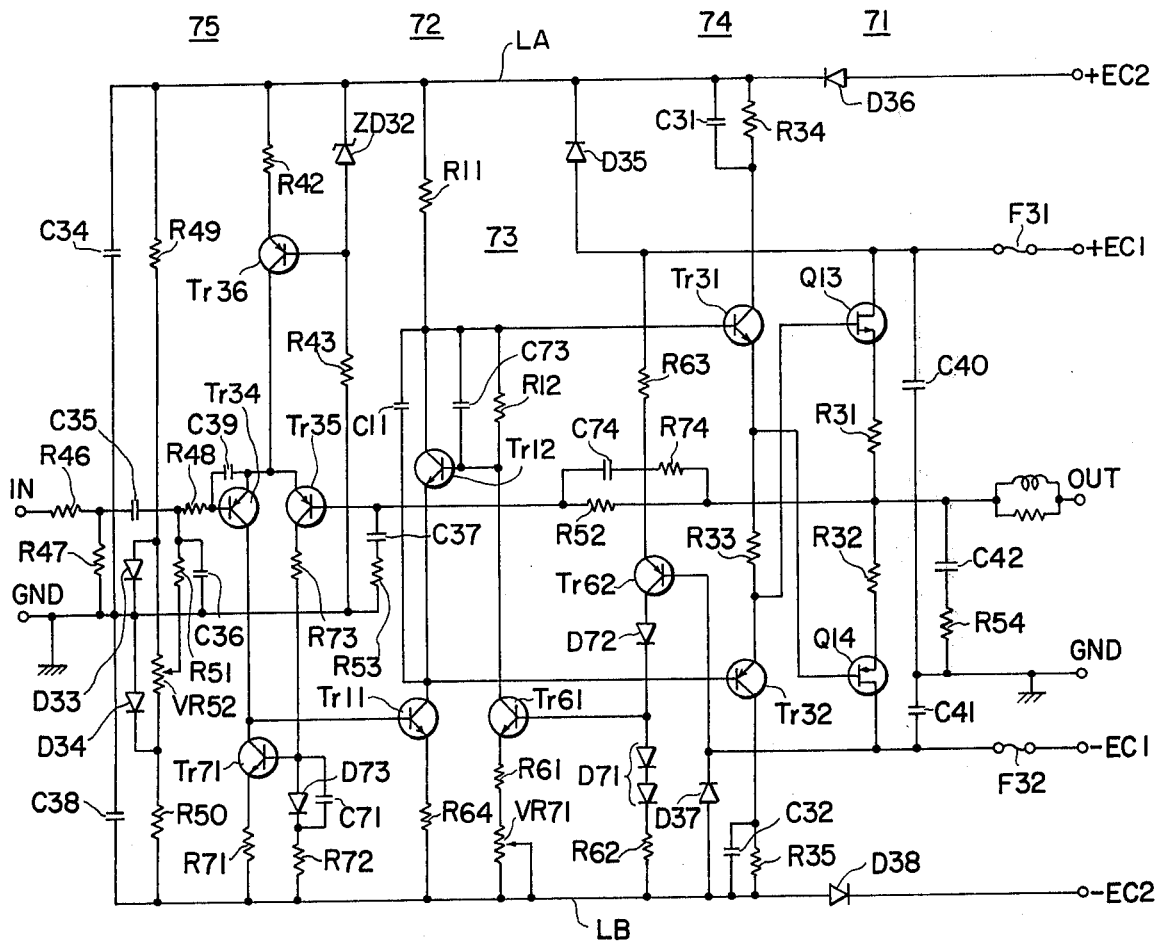
FIG. 10 is a circuit diagram, showing another example of the multi-stage direct-coupled amplifier employing the biasing arrangement of the present invention.

FIG. 10 shows another example of a multi-stage amplifier embodying the present invention. This amplifier is comprised of: a power amplifying stage 71 having an arrangement same as that of the power amplifying stage 31 in FIG. 6; a buffer stage 74 having the same arrangement as that of the buffer stage 34 in FIG. 6; a pre-drive stage 75 having a substantially same arrangement of the pre-drive stage 35 in FIG. 6; and a drive stage 62 including a biasing circuit 73 and having a substantially same arrangement of the drive stage 62 and the biasing circuit 63 in FIG. 7.

In this biasing circuit 73, a series-connection of diodes D71 functions as the constant voltage source $E_S$ of FIG. 7, and a diode D72 connected in series to the collector circuit of the transistor Tr62 prevents the flow of a reverse collector current to the transistor Tr62. The collector current of the transistor Tr61, i.e. the current flowing through the resistor R12 can be adjusted by a variable resistor VR71 connected in series to the emitter circuit of the transistor Tr61. In the pre-drive stage 75, a transistor Tr71, resistors R71, R72 and R73, a diode D73 and a capacitor C71 constitute a collector load circuit of the transistors Tr34 and Tr35 of differential connection. Symbols C73 and C74 represent capacitors, and R74 represents a resistor.

The operation of this instant example will be appreciated easily from the previous explanations, and therefore its description is omitted.

I claim:

1. A biasing arrangement for a push-pull amplifier, comprising:
    a first transistor for driving a pair of field effect transistors forming said push-pull amplifier;
    a second transistor connected in series in the collector circuit of said first transistor, the voltage between the collector and the emitter of said second transistor being applied to the gate electrodes of said field effect transistors as the gate bias voltage for these field effect transistors;

a first resistor connected between the collector and the base of said second transistor, and a constant current source connected to the base of said second transistor for causing a substantially constant current to flow through said first resistor, the constant current having such a value that it develops, across said first resistor, a voltage sufficiently large and stabilized as compared with the voltage developed between the base and the emitter of said second transistor.

2. A biasing arrangement according to claim 1, in which said pair of field effect transistors comprise: a first field effect transistor of an n-channel type having a drain electrode connected to a positive first power source, a source electrode connected to an output terminal of said push-pull amplifier and a gate electrode, and a second field effect transistor of a p-channel type having a drain electrode connected to a negative first power source, a source electrode connected to said output terminal and a gate electrode.

3. A biasing arrangement according to claim 2, in which:

said first transistor is an npn-type transistor having an emitter connected to a negative second power source, a base applied with a signal for being amplified by said push-pull amplifier, and a collector; and said second transistor is an npn-type transistor having an emitter connected to the collector of said first transistor and to the gate electrode of said first field effect transistor, a collector connected to the gate electrode of said second field effect transistor and, via a second resistor, to a positive second power source, and a base.

4. A biasing arrangement according to claim 1, further comprising:

first means for supplying fluctuating drain voltage of one of said pair of field effect transistors to the base of said second transistor in such a way that the voltage across said second transistor is adjusted in accordance with the fluctuations in said drain voltage to thereby stabilize the drain current of said pair of field effect transistors against the fluctuations of the drain voltage of said pair of field effect transistors; and second means for supplying a signal to the base of said second transistor, said a signal being in phase with the signal developing at the emitter of said second transistor and has substantially the same amplitude as that of the latter signal.

5. A biasing arrangement according to claim 4, in which:

said pair of field effect transistors comprise: a first field effect transistor of an n-channel type having a drain electrode connected to a positive first power source, a source electrode connected to an output terminal of said push-pull amplifier and a gate electrode, and a second field effect transistor of a p-channel type having a drain electrode connected to a negative first power source, a source electrode connected to the output terminal of said push-pull amplifier and a gate electrode, and in which:

said first transistor is an npn-type transistor having an emitter connected to a negative second power source, a base applied with a signal for being amplified by said push-pull amplifier, and a collector; and said second transistor is an npn-type transistor having an emitter connected to the collector of said first transistor and to the gate electrode of said first field effect transistor, a collector connected to the gate electrode of said second field effect transistor and, via a second resistor, to a positive second power source, and a base, and in which:

said first means comprises a third resistor connected between said negative first power source and the base of said second transistor; said second means comprises another capacitor connected between said output terminal and the base of said second transistor.

6. A biasing arrangement according to claim 1, in which:

said pair of field effect transistors comprise: a first field effect transistor of an n-channel type and a second field effect transistor of a p-channel type, the respective drain electrodes of said first and second field effect transistors being connected to a positive and a negative first power sources, the respective source electrodes of said first and second field effect transistors being connected together to an output terminal of said push-pull amplifier, and in which:

said constant current source includes means for detecting fluctuations of said first power sources and means for varying the current flowing through said constant current source in accordance with said fluctuations of the power sources thereby to keep the drain currents of said first and second field effect transistors constant against said fluctuations of the power sources.

7. A biasing arrangement according to claim 6, in which:

said constant current source includes a third transistor and a fourth transistor;

the collector and the emitter of said third transistor are connected to the base of said second transistor and to a substantially constant potential line, respectively;

the base of said third transistor being connected to said line via a series connection of a constant voltage source and a second resistor;

the emitter and the base of said fourth transistor being connected to the respective drain electrodes of said first and second field effect transistors, and the collector of said fourth transistor being connected to the base of said third transistor.

8. A biasing arrangement according to claim 7, in which:

said first, said second and said third transistors are npn-type transistors and said fourth transistor is a pnp-type transistor, and in which:

said constant voltage source is of positive polarity and said line is connected to a negative second power source;

the emitter of said first transistor being connected to said negative second power source, the emitter of said second transistor being connected to the collector of said first transistor and to the gate electrode of said first field effect transistor, the collector being connected to the gate electrode of said second field effect transistor and via a third resistor to a positive second power source.

* * * * *